United States Patent [19]

Van Dyk, Jr.

[11] 4,371,175
[45] Feb. 1, 1983

[54] INFLATABLE GASKET FOR RADIO FREQUENCY SHIELDING ENCLOSURE

[75] Inventor: Garritt C. Van Dyk, Jr., Bethel, Conn.

[73] Assignee: Keene Corporation, Norwalk, Conn.

[21] Appl. No.: 294,015

[22] Filed: Aug. 18, 1981

[51] Int. Cl.³ .................... F16J 15/12; F16J 15/46; H05K 9/00
[52] U.S. Cl. .................... 277/34; 277/226; 277/230; 277/236; 277/901; 49/477; 174/35 GC
[58] Field of Search ............ 277/34, 34.3, , 228, 277/34.6, 229, 226, 230, 236, 234, 237, 235 R, 901; 49/475, 477; 174/35 GC

[56] References Cited

U.S. PATENT DOCUMENTS

| | | | |
|---|---|---|---|
| 2,757,225 | 7/1956 | Dunn | 174/35 |
| 3,055,969 | 9/1962 | Schaller | 174/35 |
| 3,260,788 | 7/1966 | Stetson | 174/35 |
| 3,296,356 | 1/1967 | McAdams | 49/483 X |
| 3,312,769 | 4/1967 | La Kaff | 174/35 GC |
| 3,413,406 | 11/1968 | Plummer | 174/3 |
| 3,437,735 | 4/1969 | Schaller | 174/35 |
| 3,501,868 | 3/1970 | Ganzinotti | 277/34.3 X |
| 3,507,974 | 4/1970 | Clark | 174/35 |
| 3,518,355 | 6/1970 | Luce | 174/35 |
| 3,691,688 | 9/1972 | Kaiserswerth | 49/394 |
| 3,717,352 | 2/1973 | Jansing et al. | 277/34.3 |
| 3,889,043 | 6/1975 | Ducros | 174/35 GC |
| 3,969,572 | 7/1976 | Rostek | 174/35 MS |
| 4,065,138 | 12/1977 | Severinsen | 277/230 |
| 4,098,633 | 7/1978 | Kersten | 156/245 |
| 4,177,353 | 12/1979 | McCormack | 277/34 X |

FOREIGN PATENT DOCUMENTS

| | | | |
|---|---|---|---|
| 761109 | 5/1954 | Fed. Rep. of Germany | 174/35 GC |
| 869620 | 11/1941 | France | 174/35 GC |
| 1239365 | 7/1960 | France | 277/226 |
| 1473325 | 2/1967 | France | 277/226 |
| 487463 | 6/1938 | United Kingdom | 277/228 |
| 862917 | 3/1961 | United Kingdom | 277/34.3 |
| 122999 | 10/1957 | U.S.S.R. | 277/34.3 |

*Primary Examiner*—Robert S. Ward, Jr.
*Attorney, Agent, or Firm*—Pennie & Edmonds

[57] ABSTRACT

An inflatable gasket provides an electrically conductive seal between conductive sections of a shielding enclosure. A flattened inflatable elastomeric tube is disposed within a flexible, conductive shielding medium mounted on or near the periphery of a conductive section of the enclosure. Inflation of the elastomeric member causes the member to elongate in the direction of the minor axis, thereby urging the shielding medium into conductive contact with adjacent sections of the enclosure. Deflation of the elastomeric member withdraws the shielding member from contact with at least one such section as a result of the elastomeric member returning to its uninflated shape due to its "memory" characteristics. In the preferred embodiment the shielding medium comprises a loosely fitting, flexible, conductive sheath.

8 Claims, 8 Drawing Figures

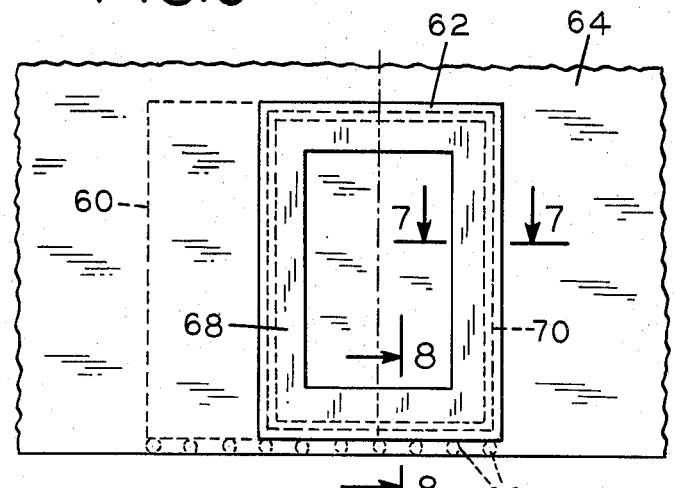
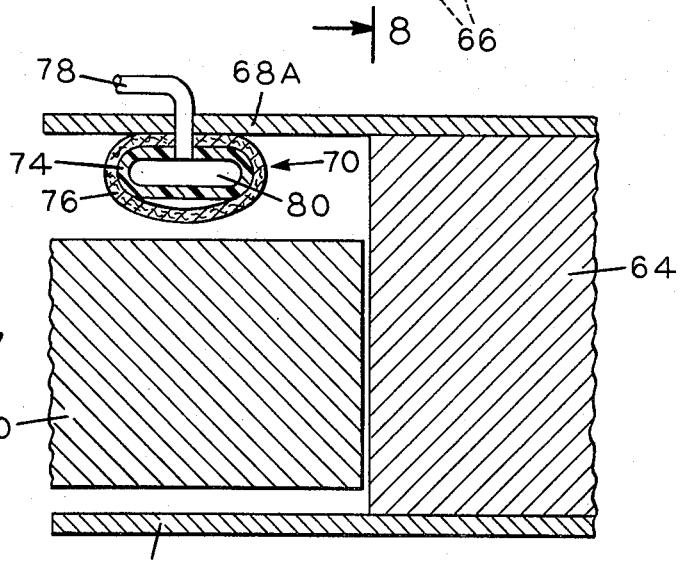
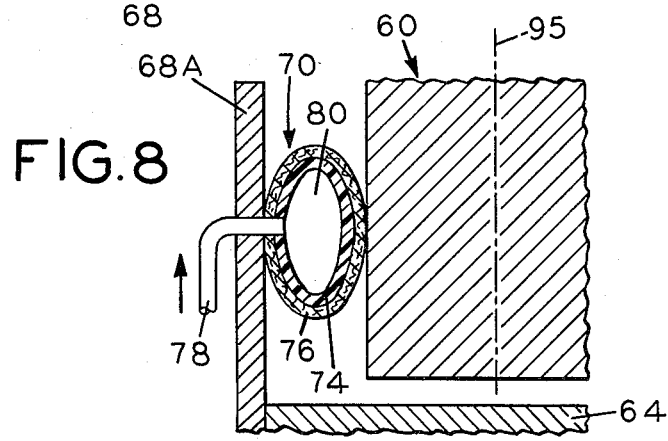

INFLATABLE GASKET FOR RADIO FREQUENCY SHIELDING ENCLOSURE

TECHNICAL FIELD

This invention relates to the field of radio frequency shielding. More particularly it relates to the field of devices which provide an electrically conductive seal between adjacent conductive sections of a shielding enclosure such as, for example, the walls or a door frame and a hinged or sliding door.

BACKGROUND ART

A major problem associated with the use of an electromagnetic or radio frequency shielding enclosure is the loss of shielding effectiveness at the space between the door providing access to the enclosure and the door frame. Several approaches to providing a continuous electrically conducting medium between the door and the door frame have been used in the past. One such approach involves the use of brass finger stock which may be configured to contact a knife-edge extension of the door, the finger stock being electrically connected to the door frame which is in turn electrically connected to the wall. Another approach involves the use of opposed conductive panels to form a door assembly which slides on rollers within the door frame. Inflatable bladders between the panels of the assembly force the panels away from each other and into contact with the door frame as disclosed in U.S. Pat. No. 3,518,355 to Luce.

Another common approach involves the use of specially prepared gaskets between the door and door frame. A tubular mesh gasket may be flattened between the door and frame by the application or force thus exerting pressure on the gasket and maximizing the electrical conductivity through the door surface, gasket and frame structure (see U.S. Pat. No. 3,055,969 to Schaller). If permanent deformation or flattening of this gasket occurs due to loss of resiliency with continued use electromagnetic radiation may leak through the seal. Yet another approach is illustrated in U.S. Pat. No. 3,507,974 to Clark. Inflatable tubing is used to bend flexible finger stock, which is electrically connected to the door structure, into contact with the frame.

A discussion of the disadvantages inherent in these approaches can be found in U.S. Pat. No. 4,177,353 to McCormack. McCormack proposes to seal the gap around a door in an electromagnetic shielding enclosure with an inflatable, tubular conductive gasket which is confined within a rigid, conductive channel having a semi-circular cross section and recessed within the frame around the door. The gasket proposed by McCormack has a sleeve or coating of conductive material over the tube. Upon inflation of this gasket the surface thereof is forced into good conductive contact with the interior of the channel in which the gasket is confined. A minor part of the gasket is not confined within the channel and, when the gasket is inflated, emerges through the open portion of the channel and, within the limits of the channel geometry and the gasket material, is capable of extruding beyond the surface of the frame in which the channel is recessed. If the adjacent surface of the door that the gasket is to contact is fairly true and in good alignment with the emergent portion of the gasket and if the adjacent surface is nowhere beyond the reach of that small emergent part of the gasket, it should be possible to make an effective seal across the gap between the frame and the door. However, the geometry of the rigid channel and the characteristics of the gasket material impose narrow limits on the ability of McCormack's seal to accommodate misalignment and variations in the gap between the frame and the door. It appears to be useful only in relatively small shielding enclosures where dynamic conditions of every day use do not work to distort the designed alignment and gap distance between the adjacent members of the shielding enclosure.

While these approaches are somewhat useful, it will be appreciated by one skilled in the art that relatively large and uneven gaps generally exist between the mating surfaces of large doors or between such doors and the adjacent surface of the surrounding frame. These gaps occur because it is extremely difficult to hold manufacturing tolerances accurately over large distances, such as the typical dimensions of the doorways of aircraft hangers which must be sealed against radio frequency leakage without incurring excessive costs. Furthermore, even if dimensions are accurately controlled, the great weight of such large doors will make it difficult to maintain the doors in proper alignment during use. Misalignment will inevitably result in gaps which vary in dimension with position along the edge of the door. If an attempt is made to use precise tolerances, such misalignment may prevent the doors from closing. Thus, attempts to reduce the size of such gaps and to keep them of uniform size so that the prior art electromagnetic seals may be effective would be expensive and involve continuing mechanical maintenance.

DISCLOSURE OF THE INVENTION

The present invention solves this problem by providing an electrically conductive gasket suitable for bridging large and uneven gaps between conductive sections of a shielding enclosure. A flexible conductive shielding medium is aligned in close proximity to or upon the periphery of a planar surface of one of the sections. An inflatable elastomeric tube with a flattened cross section is disposed within the shielding medium. The cross section of the elastomeric tube has a major axis and a minor axis. The gasket is installed with the major axis substantially parallel to one of the substantially planar surfaces with which contact is to be made. If the conditions of a particular installation tend to impose a transverse thrust on the gasket it may be mounted in a shallow cove formed in the surface of one of the parts of the enclosure. For the purposes of this description a surface having such a shallow cove is deemed to be substantially planar.

A means for inflating and deflating the elastomeric tube is provided. The means for inflating and deflating the tube comprises a source of a pressurized fluid, tubes or passageways which connect the source and the inflatable elastomeric tube and means, such as a valve, for releasing the compressed fluid. In the preferred embodiment of the invention a loosely fitting flexible conductive shielding medium or sheath, such as a metal mesh, surrounds this tube. Inflation of the elastomeric tube displaces or deforms the loosely fitting sheath to force it into contact with the opposed conductive sections of the enclosure. When the elastomeric tube is deflated, the "memory" characteristic of the elastomer returns the tube to the flattened shape to which it was initially formed and at the same time displaces or deforms the sheath so that it is withdrawn from contact with the surface of at least one of the sections.

The inflated gasket has the ability to conform to the shape and dimension of the gap between the conductive portions of the enclosure. Mechanical tolerances between, for example, a door and door frame are therefore not very critical. The mechanical clearances which are typical for cases where electromagnetic shielding is not required may be utilized. The gasket of this invention will provide excellent electrical shielding without the need for continuing service to maintain critical alignment.

BRIEF DESCRIPTION OF THE DRAWINGS

The objects and advantages of the invention are described in the following specification and the accompanying drawings in which:

FIG. 6 shows a portion of the wall of an electromagnetic shielding enclosure having an opening which is closed by a sliding or "pocket" door.

FIG. 7, taken along line 7—7 of FIG. 6, illustrates a gasket according to the invention mounted in close proximity to the periphery of the door frame structure with the elastomeric tube deflated.

FIG. 8, taken along line 8—8 of FIG. 6, is similar to FIG. 7 but illustrates the gasket with the elastomeric tube inflated.

DETAILED DESCRIPTION OF THE INVENTION

A major problem associated with the testing and maintenance of radar systems, or other electronic equipment which produces radio frequency emissions is interference with the operation of other nearby electronic equipment. In addition sensitive electronic equipment must often be protected from stray electromagnetic radiation during testing, maintenance or use of such equipment.

A common way to solve these problems is to provide radio frequency or electromagnetic shielding. When the equipment is an emitter of radiation, it can be placed temporarily in a shielding enclosure to prevent stray radiation from causing interference to nearby equipment during testing or maintenance.

As outlined above, a difficulty associated with shielding enclosures is providing a good radio frequency seal between the door (or doors) and the wall of such an enclosure. In some applications these doors may be quite large. For example, in the case of aircraft hanger doors it would not be unusual for the doors to be approximately 50 feet high and each 25 feet across. If these doors are to be part of an electromagnetic shielding hanger in which, for example, the radar or other systems installed on an aircraft may be maintained and tested without interference from electromagnetic emissions originating outside the hanger or to confine to the hanger those emissions generated by the systems on the aircraft it is required that the doors be constructed to have at least an electrically conductive exterior, that no openings exist in the doors through which electromagnetic radiation can penetrate and finally that the doors or more specifically, the conductive portions thereof are continuously electrically connected to the door frame about their periphery. The frame is of course electrically connected to the walls of the enclosure. Furthermore, the doors must be continuously electrically connected to one another.

Figure 1:
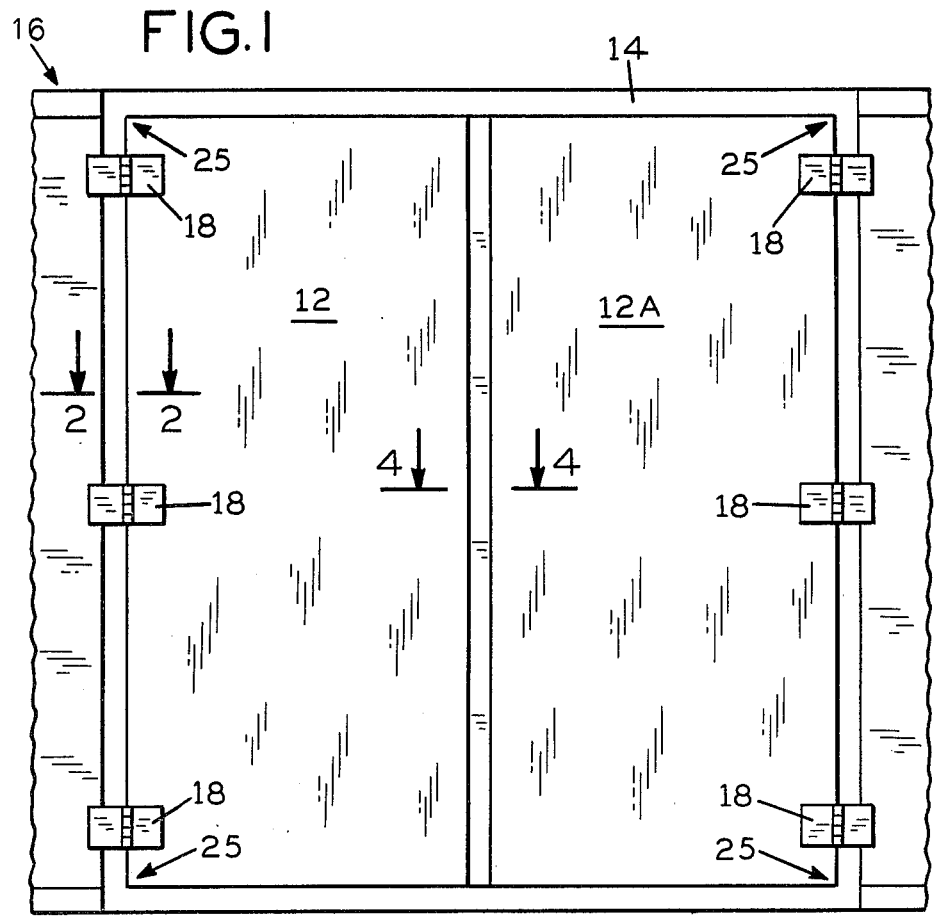
FIG. 1 illustrates a portion of a wall of an electromagnetic shielding enclosure having an opening or door frame closed by two outwardly opening hinged rectangular doors.

Referring to FIG. 1, a pair of such hinged doors 12 and 12A are mounted to frame 14 of a wall 16 of a shielding enclosure by hinges 18. Doors 12 and 12A open by swinging outward from wall 16. These doors are secured in the closed position by a conventional latch mechanism (not shown).

As will be understood by one skilled in the art, doors 12 and 12A need not be comprised of solid metal plate to be adequate conductors. It is sufficient that a nonconducting core be encased by high conductivity metal sheets or meshes. These may be brass, copper, aluminum or other metals of reasonable cost which provide adequate shielding capabilities and performance for a given application. For simplicity, these doors have been shown in cross section as being comprised of metal plate throughout their entire thickness.

Figure 2:
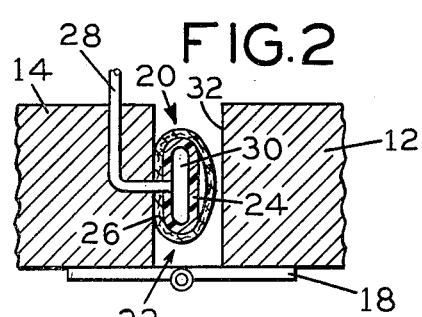
FIG. 2, taken along line 2—2 of FIG. 1, shows a gasket according to the invention with the inflatable elastomeric tube deflated.

Referring to FIG. 2, an inflatable gasket 20 according to the invention is shown disposed in the gap 22 between door 12 and frame 14. Inflatable gasket 20 may extend along the entire length of gap 22 which results from door 12 being hinged to frame 14. Gasket 20 is comprised of inflatable elastomeric tube 24 and a flexible conductive shielding medium 26 which loosely surrounds tube 24. Tube 28 serves as a passageway through which a compressed fluid, preferably air, may be conducted from a source such as a pump (not shown) to cavity 30 of inflatable tube 24. In addition a plurality of such tubes 28 may serve to support gasket 20 upon door frame 14.

Tube 24 may have a cross section of a generally flattened or elongate shape with its major axis disposed in a direction substantially parallel to surface 32 of door 12.

Figure 3:
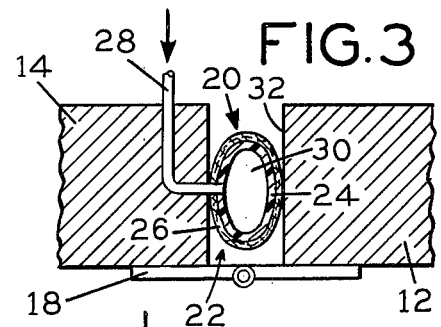
FIG. 3 is similar to FIG. 2 but shows the inflatable elastomeric tube inflated.

Referring to FIG. 3 compressed fluid is forced into cavity 30 of tube 24 causing it to expand as shown. Upon inflation the tube becomes elongate in the direction of its minor axis. The tube may shorten in the direction of its major axis. Shielding medium 26 is displaced to be forced into intimate electrical and mechanical contact with surface 32 of door 12. Inflation also forces shielding medium 26 into intimate mechanical and electrical contact with frame 14. Thus gap 22 is bridged by gasket 20 providing effective electromagnetic shielding.

Shielding medium 26 may advangageously be formed from a metal braid or mesh. As will be understood by one skilled in the art it may be advantageous for gasket 24 to extend around frame 14 to make contact with the top and bottom surfaces of doors 12 and 12A. The use of this loosely fitting mesh permits the gasket to easily turn corners providing the radius of curvature is not very small. Frame 14, door 12 and door 12A may be conveniently configured with a radius at each corner 25 to permit such application of gasket 20.

It will be understood by one skilled in the art that unless gasket 20 forms a loop which closes upon itself, as may be the case if it extends completely around frame 14, it is necessary to close off its ends to permit inflation through one or several tubes 28.

When the compressed fluid forced into cavity 30 of tube 24 is released from tube 28 and therefore from inflatable tube 24, by means such as a valve (not shown), inflatable tube 24 resumes the elongate shape shown in FIG. 2 due to the "memory" characteristics of the elastomeric material, typically a synthetic rubber, from which it is formed. Such resumption of elongate shape of the tube displaces or deforms the shielding medium moving it out of contact with the door.

Figure 4:
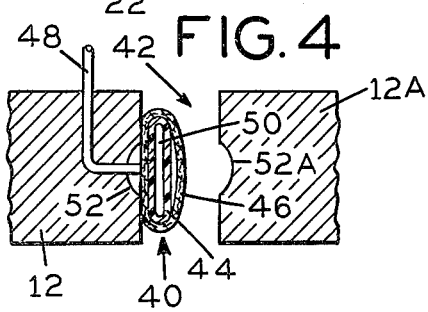
FIG. 4 taken along line 4—4 of FIG. 1, shows the inflatable elastomeric tube deflated.

Referring to FIG. 4, gasket 40 is disposed in gap 42 between doors 12 and 12A. Gasket 40 is of identical construction to gasket 20, being comprised of inflatable tube 44 and conductive flexible shielding medium 46. Inflation occurs as a result of compressed fluid being conducted by tube or passageway 48 to cavity 50 of tube 44.

Figure 5:
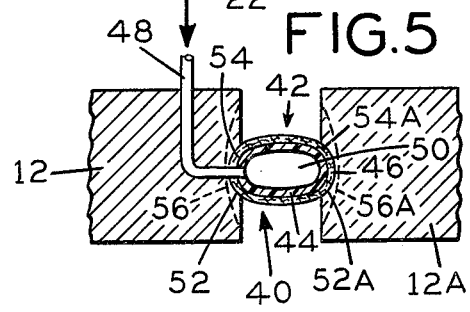
FIG. 5 is similar to FIG. 4 but shows the inflatable elastomeric tube inflated.

FIG. 4 differs from FIG. 2 in that shallow coves 52 and 52A have been provided in doors 12 and 12A. Referring to FIG. 5 inflation of tube 44 results in its major axis becoming elongate, forcing shielding medium 46 into intimate mechanical and electrical contact with the surfaces 54 and 54A of coves 52 and 52A. The minor axis of tube 44 becomes shortened. It will be understood by one skilled in the art that it is advantageous for tube 48 to be formed from a compressible material or one that is flexible and loosely fitting within door 12 to permit shielding medium 46 to move into contact with surface 54. This is unnecessary however if the coves are wider as shown by dotted lines 56 and 56A in FIG. 5.

Referring to FIG. 6 a "pocket" door 60 which slides within frame 62 of wall 64 of a shielding enclosure is illustrated. A series of rollers 66 on a rolling track of a type well known in the art are provided to facilitate the motion of door 60. Gasket 70 according to the invention provides an electrically conductive seal between a frame extension member 68A shown in FIG. 7 and door 60.

Referring to FIG. 7 gasket 70, of identical construction to gasket 20, is mounted on frame extension member 68A, an internal frame component located within the electromagnetic shielding enclosure. Gasket 70 extends around the periphery of frame 62 as shown. Inflation of elastomeric tube 74 by means of a compressed fluid forced into cavity 80 through tube 78 forces shielding medium 76 into contact with door 60. Members 68 and 68A and wall 64 are shown as metal slabs, but as indicated above with respect to doors 12 and 12A, may be nonconductors covered with an appropriate conductive material.

Referring to FIG. 8 gasket 70 is shown disposed between frame extension member 68A and door 60. Gasket 70 is shown in its inflated condition, with elastomeric tube 74 pressurized by fluid forced into cavity 80 through tube 78. Shielding medium 76 is thus forced into contact with door 60 and frame extension member 68A providing electromagnetic shielding by bridging the gap between them. For simplicity rollers 66 have not been shown between door 60 and wall 64. It is understood that an additional gasket 70 may be used between external frame extension member 68 and the outside of door 60. FIG. 8 would then be symmetrical about line 95 which represents a plane parallel to the inside and outside surfaces of door 60. In other words, a mirror image of what is shown as being to the left of line 95 would also exist to the right of line 95. While not generally required this would assure adequate electromagnetic sealing in difficult applications. If even this were not adequate or if adequate in the alternative, frame member 68A could be readily extended and a second gasket 70 extending around frame 62 could be placed between frame member 68A and door 60 above the one shown.

It will be understood by one skilled in the art that it is also possible that gasket 70 could be mounted near the periphery of door 60 so as to contact frame extension member 68 or 68A when inflated to provide a seal along the entire periphery of door 60. This has the disadvantage of requiring that compressed fluid be conducted to a moving door through means such as a flexible tube.

In operation, none of the inflatable gaskets described above is inflated until the door (or doors) is closed. Before the door may be opened pressure must be released and the inflatable tube deflated to move the shielding medium 76 out of contact with the door so that excessively large forces are not required to open the door and large shear forces are not created which could damage the shielding media.

While the invention has been described with respect to what is its chief area of application, which is providing an electromagnetic seal between the door and door frame of an electromagnetic shielding enclosure, it is recognized that it can be used to provide a seal between any two conductive sections of such an enclosure. While it is customary in a permanently erected structure to electrically connect the walls by permanent means as is well know in the art it is understood that the invention described above may be used to electrically connect two walls or the wall and ceiling of such an enclosure. This might be particularly useful in the case of a prefabricated structure which may be repeatedly assembled and disassembled.

In addition, while the invention is particularly useful for large structures, where there are large and uneven gaps between the conductive sections, it may in appropriate cases be applied to smaller structures such as the doors of cabinets used to shield radiofrequency transmitters.

Various other applications and modifications of the invention in addition to those described herein will become apparent to one skilled in the art from the above drawings and description which have been offered by way of illustration only and not in limitation of the invention, the scope of which is defined in the appended claims.

I claim:
1. An inflatable gasket for providing an electrically conductive seal between first and second adjacent conductive sections of a shielding enclosure comprising:
   (a) an inflatable elastomeric tube secured to a substantially planar surface of said first section and aligned in close proximity to the periphery of said first section, said tube having a flattened cross-section having a major axis extending parallel to said planer surface and a minor axis when uninflated and becoming elongate in the direction of said minor axis when inflated;
   (b) a loosely fitting flexible deformable shielding medium surrounding said tube; and
   (c) means through which said tube may be inflated and deflated whereby shielding medium is deformed into contact with said second section when said tube is inflated and is deformed out of contact with said second section when deflated.

2. An inflatable gasket for providing an electrically conductive seal between adjacent conductive sections of a shielding enclosure comprising:
   (a) an inflatable elastomeric tube secured to one of said sections and aligned in close proximity to the periphery of said section, said tube having a flattened cross section with a major axis and a minor axis, said tube being installed with said major axis parallel to a surface of said enclosure sections, and said tube becoming elongate in the direction of said minor axis when said tube is inflated;
   (b) a flexible displaceable conductive shielding medium surrounding said tube; and
   (c) means through which said tube may be inflated and deflated, whereby said shielding medium is displaced into contact with said sections when said tube is inflated, and is displaced from contact with a surface of at least one of said sections when said tube is deflated.

3. The gasket according to any of claims 1 or 2 mounted in a shallow cove in one of said sections.

4. The gasket according to any of claims 1 or 2 wherein the shielding medium is a metal mesh.

5. The gasket according to any of claims 1 or 2 which is disposed so that it withdraws from contact with a shallow cove in one of said sections when it is deflated.

6. The gasket according to any of claims 1 or 2 disposed to provide a seal between a door and a wall of said enclosure.

7. The gasket according to any of claims 1 or 2 wherein the means through which said tube is inflated and deflated comprises at least one tube or passageway through which compressed fluid may be conducted into and released from said tube.

8. The gasket according to claim 7 wherein said tube or passageway through which compressed fluid is conducted to said tube is connected to a source of compressed fluid and a means for releasing said fluid from said tube or passageway.

* * * * *